DIELECTRIC CIRCUIT FORMING PROCESS

Filed Oct. 8. 1971 2 Sheets-Sheet 1

DIELECTRIC CIRCUIT FORMING PROCESS

Filed Oct. 8. 1971

United States Patent Office 3,748,246

Patented July 24, 1973

3,748,246

DIELECTRIC CIRCUIT FORMING PROCESS

James Emanuel Goell, Middletown, N.J., assignor to Bell Telephone Laboratories, Incorporated, Murray Hill, N.J.

Filed Oct. 8, 1971, Ser. No. 187,807
Int. Cl. C23c *15/00*
U.S. Cl. 204—192 5 Claims

ABSTRACT OF THE DISCLOSURE

There is disclosed a process for forming integrated optical circuit components on a substrate wafer in the form of dielectric thin films in patterns of high resolution and edge smoothness. For high resolution, the use of electron-resist and electron-beam exposure techniques are described. Particularly disclosed is the use of an aluminum mask formed over the circuit layer, the exposed portions of which are sputter etched away in an atmosphere that includes oxygen to preserve the aluminum mask. After the mask is chemically etched away, the resulting damage to the quality of the surface of the underlying circuit is restored by sputter etching the damaged surface. The use of films of silica and barium oxide in selected proportions that can be varied in different cases to achieve desired index relationships is facilitated by the cathode sputtering. Cathode sputtering, more than any known alternative, avoids the formation of microcrystallites in the film.

BACKGROUND OF THE INVENTION

This invention relates to the fabrication of light-guiding optical circuits formed from glassy films.

It has been proposed that optical signals can be processed using a form of integrated circuitry similar to that used for microwaves. Such a proposal is found in the article by S. E. Miller, "Integrated Optics. An Introduction," The Bell System Technical Journal, vol. 48, p. 2059, (September 1969). Such circuitry would find important applications in high-capacity optical communication systems and optical computers. The circuits could include strip lightguides including specific components such as directional couplers, fiters and interconnections. It has been previously demonstrated that thin films exhibiting low optical loss can be produced.

Edge smoothness is perhaps the most important consideration in the generation of lightguides. Unless the edges of the guide are very smooth, excessive scattering loss will result. This edge smoothness is particularly difficult to achieve with strip guides of the desired dimensions, typically about one micrometer by three micrometers. Strip guides of these overall dimensions can be achieved with sufficient resolution by use of electron-resist techniques and electron-beam exposure.

Specifically, unless the edges of the guide are very smooth, excessive scattering loss will result. Computations have shown that under worst-case conditions a loss of about 1 db./cm. would result from an edge with about 500 A. units root means square deviation for a one percent refractive index difference between the lightguide and its surrounding at a transmitted wavelength of about one micrometer. In general, decreasing the refractive index difference will decrease the scattering loss.

Nevertheless, improved fabrication processes are needed in order to improve the attained edge smoothness of the glassy-type optical strip guides.

SUMMARY OF THE INVENTION

According to my invention, the desired optical strip guides and circuits are formed on a substrate wafer on which the circuit material is deposited as a thin film and, typically, an aluminum mask is formed thereover by the use of electron-resist techniques. The exposed portions of the circuit layer are sputter etched away in an atmosphere that includes oxygen to preserve the aluminum mask, the mask is chemically etched away, and the quality of the surface of the underlying circuit is restored by sputter etching the damaged surface. Improve edge smoothness of the resulting guide or circuit is indicated in my experimental results.

Moreover, according to even broader aspects of my invention, it is merely necessary that a sputter-resistant mask be formed over the glassy circuit layer by appropriate high-resolution resist techniques, that the exposed portions of the surface layer be sputter etched away under conditions that preserve the mask and that, after the mask is removed, the quality of the surface of the underlying circuit be restored. The surface quality is restored typically by relatively brief sputter etching.

BRIEF DESCRIPTION OF THE DRAWING

Further features and advantages of my invention will become apparent from the following detailed description taken together with the drawing, in which.

DESCRIPTION OF ILLUSTRATIVE EBMODIMENTS

Figure 1:
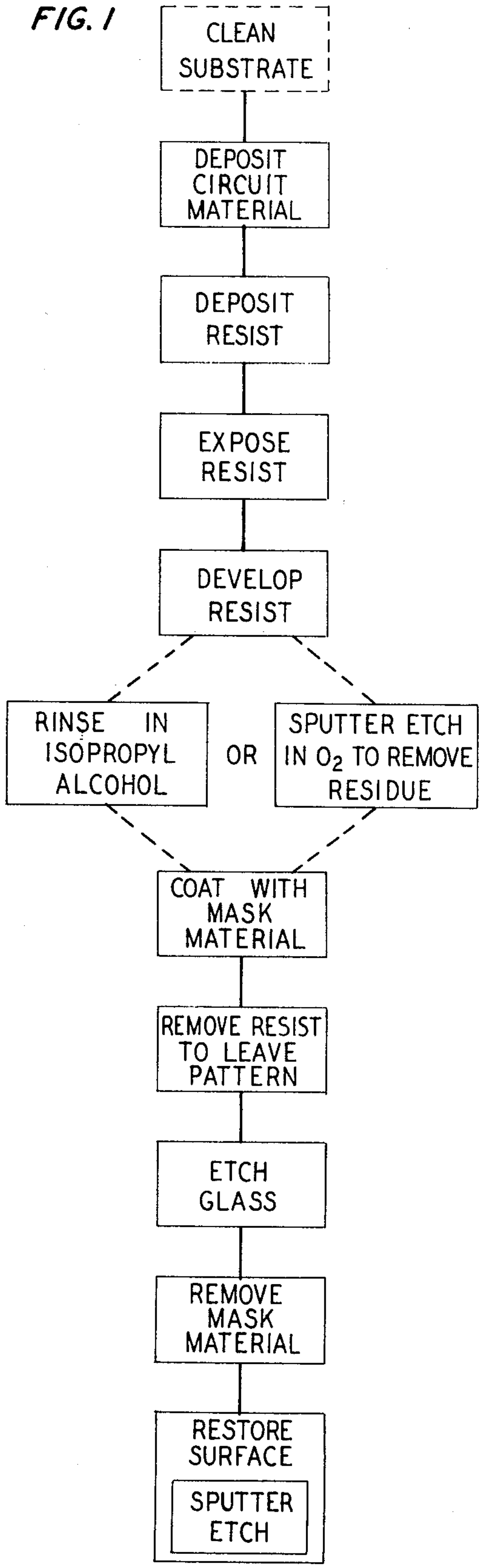
FIG. 1 is a block diagrammatic flow chart of an illustrative process according to my invention.

The process of FIG. 1 starts with a substrate which has been cleaned, as shown in the optical step indicated in the dotted box. Illustratively, the substrate is a high-quality low-loss relatively low-index glass such as is provided by a microscope slide. Cleaning techniques are standard in the art. Next, the substrate, for instance the substrate 11 of FIG. 2A, has deposited thereon a circuit material 12 which is an approximately 0.3-micrometer-thick film of a glass, such as the 7059 glass, available from Corning Corporation. In the next step of the process an electron-resist is deposited in a continuous film 13 over the circuit material 12, as indicated in the third step of the process of FIG. 1. Illustratively, this result is achieved by spin coating a roughly one-micrometer-thick film of poly-(methylmethacrylate) (PMMA) on to the circuit material.

In the fourth step of the process of FIG. 1, the electron-resist 13 is then exposed by an electron-beam which is deflected to produce the desired pattern with the desired resolution. Thereafter, the electron-resist is developed. The development of the electron-resist removes the exposed portion thereof as indicated by the gap in the layer 13 in FIG. 2B. Still further, this step is carried to its logical conclusion to insure that all resist is removed from the top of circuit material 12 in the developed area by rinsing the central portion of the assembly in isopropyl alcohol to remove the residue of the PMMA which randomly adheres to the top surface of circuit material 12. This rinse does not substantially affect the remainder of the resist 13.

Figure 2A:
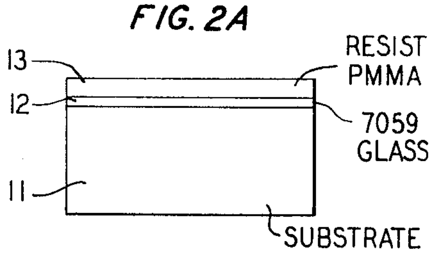
FIGS. 2A through 2F show intermediate through final products of the process of FIG. 1 in pictorial form for certain key steps of the process of FIG. 1.
Figure 2B:
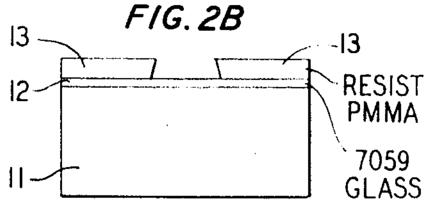
Figure 2C:
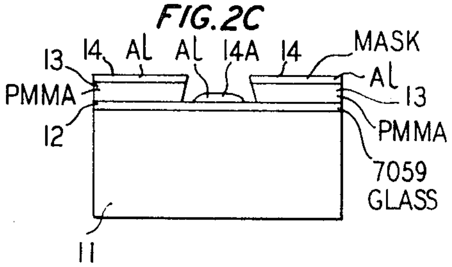

Alternatively, as indicated by the optional branching of the process of FIG. 1, at this point the residual exposed and developed resist in the gap of FIG. 2B can be removed by sputter etching the surface of the exposed glass circuit material 12 in oxygen to remove the residue.

Figure 2D:
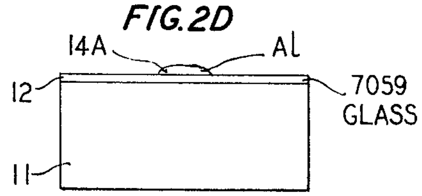

The next step of the process of FIG. 1 is relatively significant. A roughly 2500 A-unit-thick coating 14 of aluminum, or other sputter-resistant mask material, is deposited on the remaining electron-resist 13 and on the exposed portion of the circuit material 12. Next the remaining PMMA electron-resist 13 is dissolved with acetone so that both it and the remaining aluminum mask material above it are removed. That portion of the aluminum mask material is removed because it no longer has a surface to adhere to. The remainder of aluminum coating, which is mask 14A, is unaffected by the acetone. The removal of the remaining resist leaves the mask 14A in the form of the desired circuit pattern, on top of the circuit material 12, as shown in FIG. 2D.

Figure 2E:
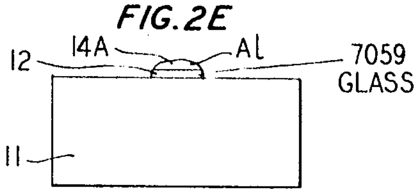

To reproduce the same pattern in the circuit material 12, the portion thereof not masked by mask 14A is sputter etched away to produce the intermediate product of FIG. 2E. In this step, oxygen is used as the sputtering gas in order to slow the rate of sputtering of the aluminum mask 14A.

Figure 2F:
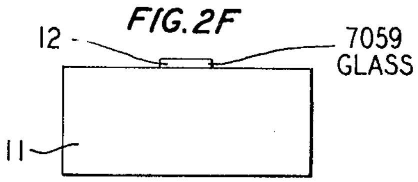

In the next to last step of the process of FIG. 1, the remaining aluminum is removed with a chemical etchant such as sodium hydroxide. This step is simple and efficient but nevertheless leaves some minor surface damage to the top of the optical waveguiding circuit composed of the remainder of the film of material 12. The circuit illustratively has the cross-section shown in the final product illustration of FIG. 2F. Since top surface damage increases optical loss, my process provides an optional step to restore the surface of the waveguiding circuit 12, as indicated in the last step of the process of FIG. 1. This surface restoration is accomplished by briefly sputter etching it to remove any damage to it caused by the deposition and chemical removal of the aluminum mask 14A.

The following variations of the process of FIG. 1, as illustrated in FIG. 2A, are of interest to the successful use of the final product. Since the scattering loss from the optical waveguiding circuit 12 drops with decreasing index difference between it and its surroundings such as substrate 11 and the atmosphere above it, it is anticipated that an optimum compromise index of refraction for the guiding device, or circuit 12, can be achieved by using glass films, such as sputtered mixtures of barium oxide and silica which I have devised, whose indices can be controlled by changing the ratio of the constituents. In fact, practical structures exhibiting low loss can be produced. Furthermore, the index of the composite film can be varied over a wide range without the inclusion of crystallites within the glass because the use of cathode sputtering tends to affect the formation of such crystallites.

Figure 3:
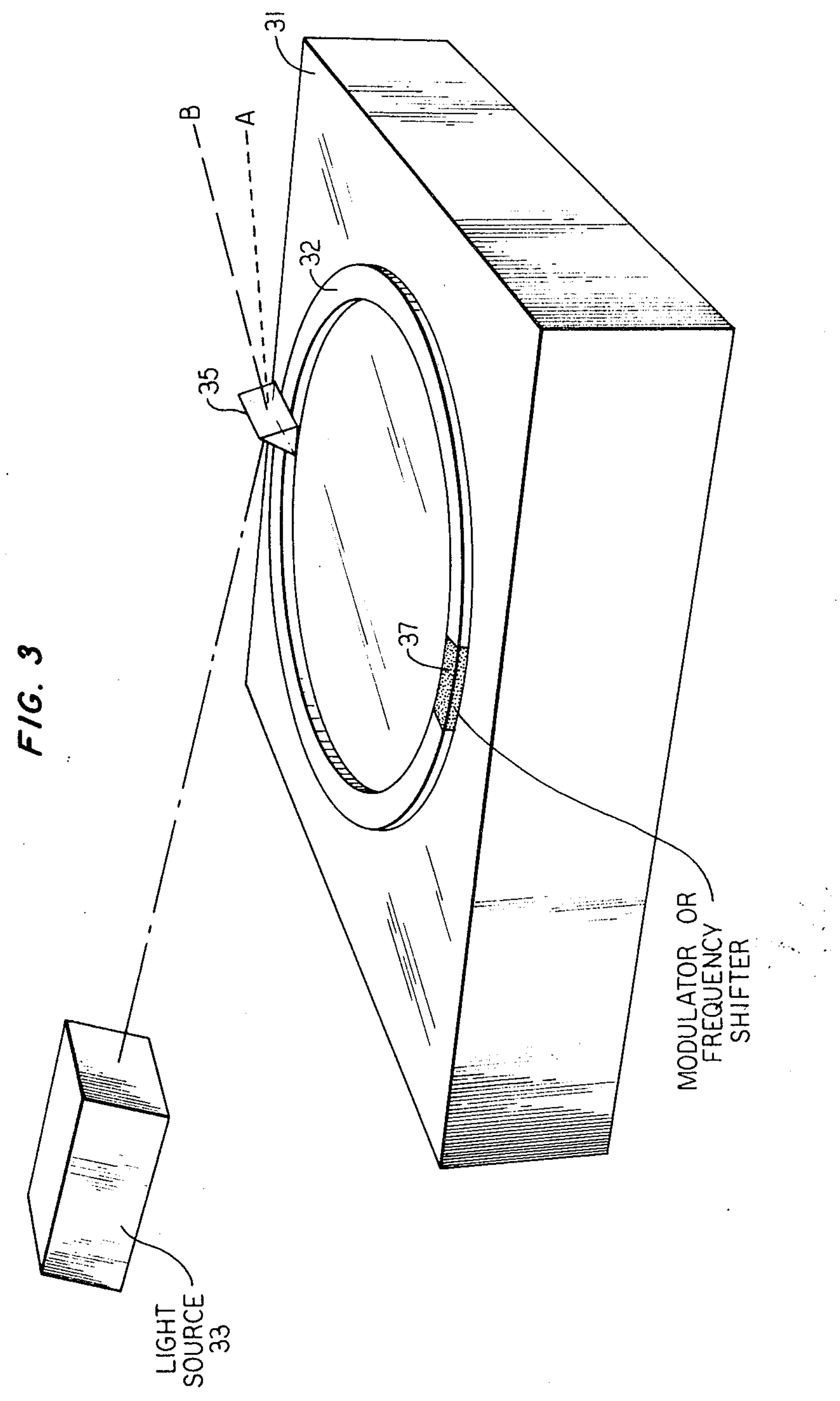
FIG. 3 is a partially pictorial and partially block diagrammatic illustration of an illustrative application of a glassy strip guide and circuit according to my invention.

An actual experimental embodiment of my invention is shown in FIG. 3, with the addition of a modulator included for indicating illustrative utility. The optical waveguiding circuit 32 was produced in an oval form with a varying curvature, parallel to the plane of the top surface of substrate 31. There could be included in the optical waveguiding circuit 32 a utilization circuit such as a modulator or frequency shifter, but such a use of the circuit is merely illustrative. Coherent light from a light source 33 is coupled into guide 32 by means of a prism film coupler including the prism 35 spaced from the top surface of optical waveguiding circuit 32 by a low-index film, an air gap, or by an air gap determined by the presence of dust particles on the top surface of the guiding circuit 32. In some of my experiments, the waveguiding circuit 32 was about 3.5 micrometers wide. Edge deviation was about 500 A. units, attributable mainly to unevenness in the aluminum mask occurring during its deposition. My experiments showed that 0.6328 micrometer light from a helium neon laser is launched by the prism 35 into the waveguiding circuit 32. This technique is now well known in the optical waveguiding art. In particular, the necessary phase-matching for a particular frequency and mode of propagation of light in circuit 32 is provided by the appropriate choice of the angle of incidence of the beam from source 33 upon the entrance surface of prism 35, which correspondingly determines its angle of internal refraction and its angle of frustrated internal reflection, at the base of prism 35.

More specifically, the glass waveguiding circuit 32 had an index of refraction of 1.61; and the substrate 31 had an index of refraction of 1.52. The major diameter of the ellipse formed by circuit 33 was about three millimeters.

Further details concerning certain features of my invention are as follows. High quality films have been produced by cathode sputtering mixtures of barium oxide and silica ($SiO_2$). Using these mixtures, low-loss films can be produced with refraction indices running from about 1.46 to at least 1.66.

Specifically, these films were obtained when the circuit-material-depositing step of my process comprised sputtering onto the substrate a mixture of barium oxide (BaO) and silica ($SiO_2$) in a glassy phase. The mixture is selected to provide a desired index of refraction.

Typically, the foregoing sputtering comprised cathode sputtering the mixture from a fused silica cathode onto which barium carbonate or barium oxide powder had been fused or melted by an oxygen-acetylene torch or which had been formed by hot-pressing a mixture of BaO and $SiO_2$ powders, or by direct fusion of BaO and $SiO_2$.

It has also been shown that by sputtering a low index layer of a clear glassy dielectric on a substrate before sputtering the guiding layer thereon, still lower loss films can be produced than by the technique described above, apparently because the first sputtered layer tends to cover some of the substrate imperfections.

An interesting corollary of the foregoing is that it has been shown that sputtering a low index layer of a transparent glassy material over the guiding layer also reduces the loss. This variation has the effect of lowering the index difference at the top face of the guiding film, thus reducing the effect of film irregularities caused by substrate irregularities and defects in the sputtered film.

The surprising versatility of aluminum films for use as masks in processes according to my invention suggests a further possible means of pattern formation, utilizing aluminum's low sputtering rate in oxygen. For example, a slide could be made of layers of optical waveguiding film of one medium, with a second transparent thin film medium sputtered thereover and then a layer of aluminum coated on top of the second medium. This intermediate product could be coated with a suitable resist over the top of the aluminum. A pattern would next be formed in the resist by electron beam or optical means. Then the resist would be developed; and the exposed aluminum etched away by a chemical means by sputtering in argon. Next the glass could be etched by sputtering in oxygen to remove one layer of glassy film where not masked; and the aluminum mask could be removed by chemical etching. Finally, the optical properties of the overlying glassy film could be restored by a relatively brief sputter etching. Alternatively, a higher-index transparent material could be deposited in the depressions to form the optical waveguiding circuit.

What is claimed is:

1. A process for forming integrated optical circuit components on a substrate wafer comprising the steps of sputtering onto the substrate a mixture of BaO and $SiO_2$ in a glassy phase, the mixture being selected to provide a desired index of refraction, forming a sputter-resistant mask shaped in a desired circuit pattern over said layer, sputter etching away the exposed portions of said layer, chemically etching away the mask, and sputter etching the resulting circuit to restore surface quality.

2. A process according to claim 1 in which the mixture sputtering step comprises cathode sputtering the mixture from a fused silica cathode on which barium silicate powder has been fused, including applying radio-frequency excitation between the substrate and said cathode.

3. A process according to claim 1 in which the sputtering step comprises preparing a sputtering cathode by fusing a mixture of barium oxide and silica onto a suitable electrode support, and cathode sputtering the mixture from the cathode to the substrate.

4. A process according to claim 1 in which the sputtering step comprises preparing a sputtering cathode by hot-pressing a mixture of barium oxide and silica onto a suitable electrode support, and cathode sputtering the mixture from the cathode to the substrate.

5. A process according to claim 4 in which the step of depositing a layer of glassy material comprises sputtering onto the substrate from a cathode a mixture of BaO and $SiO_2$, and exciting said cathode with respect to said substrate with radio frequency excitation to liberate said mixture from said cathode.

References Cited

UNITED STATES PATENTS

| | | | |
|---|---|---|---|
| 3,410,774 | 11/1968 | Barson et al. | 204—192 |
| 3,585,121 | 6/1971 | Franks et al. | 204—192 |
| 3,479,269 | 11/1969 | Brynes et al. | 204—192 |
| 3,474,021 | 10/1969 | Davidse et al. | 204—192 |
| 3,598,710 | 8/1971 | Davidse | 204—192 |

JOHN H. MACK, Primary Examiner

S. S. KANTER, Assistant Examiner